(12) United States Patent
Huang et al.

(10) Patent No.: US 11,775,102 B2
(45) Date of Patent: Oct. 3, 2023

(54) TOUCH DISPLAY DEVICE AND MANUFACTURING METHOD THEREOF, AND TERMINAL

(71) Applicants: Chengdu BOE Optoelectronics Technology Co., Ltd., Sichuan (CN); BOE Technology Group Co., Ltd., Beijing (CN)

(72) Inventors: Weiyun Huang, Beijing (CN); Yue Long, Beijing (CN); Yao Huang, Beijing (CN); Chao Zeng, Beijing (CN); Meng Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 672 days.

(21) Appl. No.: 16/958,930

(22) PCT Filed: Jul. 31, 2019

(86) PCT No.: PCT/CN2019/098703
§ 371 (c)(1),
(2) Date: Jun. 29, 2020

(87) PCT Pub. No.: WO2021/016944
PCT Pub. Date: Feb. 4, 2021

(65) Prior Publication Data
US 2023/0152919 A1    May 18, 2023

(51) Int. Cl.
*G06F 3/041* (2006.01)

(52) U.S. Cl.
CPC ........ *G06F 3/04164* (2019.05); *G06F 3/0412* (2013.01); *G06F 2203/04102* (2013.01);
(Continued)

(58) Field of Classification Search
CPC .............. G06F 3/04164; G06F 3/0412; G06F 2203/04102; G06F 2203/04103; G06F 2203/04105
See application file for complete search history.

(56) References Cited

U.S. PATENT DOCUMENTS

| 2008/0218492 A1 | 9/2008 | Endo |
| 2011/0304564 A1 | 12/2011 | Kim et al. |

(Continued)

FOREIGN PATENT DOCUMENTS

| CN | 104820519 A | 8/2015 |
| CN | 105975131 A | 9/2016 |
| CN | 106055159 A | 10/2016 |

OTHER PUBLICATIONS

International search report of PCT application No. PCT/CN2019/098703 dated Apr. 26, 2020.

*Primary Examiner* — Peter D McLoone
(74) *Attorney, Agent, or Firm* — Lippes Mathias LLP (57) ABSTRACT

The present disclosure relates to a touch display device and a manufacturing method thereof, and a terminal, which belongs to the technical field of display. The touch display device includes a display panel, a touch panel disposed on a display side of the display panel, a touch driving circuit, and a touch flexible printed circuit board, wherein the display panel includes a first region, and a second region extending outside the first region on at least one edge of the first region; the touch flexible printed circuit board electrically connects the touch panel with the touch driving circuit disposed on a non-display side of the display panel, and an orthographic projection of the first terminal of the flexible printed circuit board connected to the touch panel on the display panel is disposed in the second region.

18 Claims, 5 Drawing Sheets

(52) U.S. Cl.
CPC ............ *G06F 2203/04103* (2013.01); *G06F 2203/04105* (2013.01)

(56) References Cited

U.S. PATENT DOCUMENTS

2013/0328807 A1* 12/2013 Matsumoto ........... G06F 3/0446
 345/173
2020/0326804 A1* 10/2020 Oh ......................... G06F 3/047

* cited by examiner

| Providing a display panel, wherein the display panel comprises a first region, and a second region extending outside the first region on at least one edge of the first region, a length of a boundary line between the first region and the second region being less than a length of the at least one edge | 1001 |

| Providing a touch panel, a touch driving circuit, and a touch flexible printed circuit board, wherein the touch panel comprises a touch electrode and a touch signal line electrically connected to the touch electrode; the touch flexible printed circuit board comprises a first terminal and a second terminal that are electrically connected, the first terminal being electrically connected to the touch signal line, the second terminal being electrically connected to the touch driving circuit | 1002 |

| Arranging the touch panel on a display side of the display panel, and enabling an orthographic projection of the first terminal on the display panel to fall within the second region, wherein an orthographic projection of the touch electrode on the display panel falls within the first region, the touch flexible printed circuit board is bent to a non-display side of the display panel, and the touch driving circuit is disposed on the non-display side of the display panel | 1003 |

FIG. 10

TOUCH DISPLAY DEVICE AND MANUFACTURING METHOD THEREOF, AND TERMINAL

CROSS-REFERENCE TO RELATED APPLICATION

The present application is a 371 of PCT Application No. PCT/CN2019/098703, filed on Jul. 31, 2019, the entire contents of which are incorporated by reference herein.

TECHNICAL FIELD

The present disclosure relates to the technical field of display, and more particularly, relates to a touch display device and a manufacturing method thereof, and a terminal.

BACKGROUND

A touch display device is a display device with a touch function.

The touch display device generally includes a display panel, and a touch panel disposed on a display surface of the display panel. The touch panel can collect touch information, and cooperate with the display panel to realize a touch function.

SUMMARY

Embodiments of the present disclosure provide a touch display device and a manufacturing method thereof, and a terminal. The technical solutions are as follows.

According to a first aspect of the embodiments of the present disclosure, a touch display device is provided. The touch display device includes: a display panel, wherein the display panel includes a first region, and a second region extending outside the first region on at least one edge of the first region, a length of a boundary line between the first region and the second region being less than a length of the at least one edge, and an effective display area of the display panel being disposed in the first region;

a touch panel, wherein the touch panel is disposed on a display side of the display panel, and includes a touch electrode and a touch signal line electrically connected to the touch electrode, an orthographic projection of the touch electrode on the display panel falling within the first region;

a touch driving circuit disposed on a non-display side of the display panel; and a touch flexible printed circuit board, wherein the touch flexible printed circuit board includes a first terminal and a second terminal that are electrically connected, the first terminal being electrically connected to the touch signal line, the touch flexible printed circuit board being bent to the non-display side of the display panel, the second terminal being electrically connected to the touch driving circuit;

wherein an orthographic projection of the first terminal on the display panel falls within the second region.

Optionally, the second region includes at least one sub-track region, the first terminal includes at least one first sub-terminal, an orthographic projection of each of the at least one first sub-terminal on the display panel falling within the at least one sub-track region in one-to-one correspondence, and each of the at least one first sub-terminal being electrically connected to the touch signal line.

Optionally, the second terminal includes at least one second sub-terminals, the at least one second sub-terminals being electrically connected to the at least one first sub-terminal in one-to-one correspondence, and being electrically connected to the touch driving circuit.

Optionally, the touch driving circuit includes at least one sub-driving circuit electrically connected to the at least one second sub-terminal in one-to-one correspondence.

Optionally, the first region is approximately in a rectangular shape, the number of sub-track regions is equal to 2, the second region includes a first sub-track region and a second sub-track region, and the first sub-track region and the second sub-track region being respectively disposed on two opposite ends of a first edge of the first region proximal to a fan-out region of the display panel.

Optionally, each of a length of the first sub-track region and the second sub-track region in a direction perpendicular to the first edge of the first region is greater than or equal to a specified tolerance, the specified tolerance being a tolerance in the case where the touch panel is arranged on the display side of the display panel.

Optionally, the specified tolerance is about 0.3 millimeters.

Optionally, the touch display device includes an optically clear adhesive disposed between the touch panel and the display panel.

Optionally, the second region is approximately in a trapezoidal shape; and a longer edge is disposed on a side of a shorter edge proximal to the first region in two parallel edges of the second region.

Optionally, the touch display device includes a pressure sensitive adhesive, a bottom film and a foam that are sequentially arranged on a surface of the display panel distal from the touch panel, the pressure-sensitive adhesive, the bottom film and the foam being stacked in a direction going distally from the display panel;

wherein the touch flexible printed circuit board bent to the non-display side is attached to a side of the foam distal from the display panel.

Optionally, the touch display device is a folding touch display device including a rotating shaft, the rotating shaft being parallel to the first edge.

Optionally, the second region includes the at least one sub-track region, the first terminal includes the at least one first sub-terminal, the orthographic projection of the at least one first sub-terminal on the display panel falling within the at least one sub-track region in one-to-one correspondence, and each of the at least one first sub-terminal being electrically connected to the touch signal line;

the second terminal includes the at least one second sub-terminal, and the at least one second sub-terminal being electrically connected to the at least one first sub-terminal in one-to-one correspondence, and being electrically connected to the touch driving circuit;

the touch driving circuit includes the at least one sub-driving circuits electrically connected to the at least one second sub-terminals in one-to-one correspondence; and the second region is approximately in a trapezoidal shape, and the longer edge is disposed on the side of the shorter edge proximal to the first region in the two parallel edges of the second region.

According to a second aspect of the embodiments of the present disclosure, a manufacturing method of a touch display device is provided. The method includes:

providing a display panel, wherein the display panel includes a first region, and a second region extending outside the first region on at least one edge of the first region, and a length of an boundary line between the first region and the second region being less than a length of the at least one edge;

providing a touch panel, a touch driving circuit and a touch flexible printed circuit board, wherein the touch panel includes a touch electrode and a touch signal line electrically connected to the touch electrode; the touch flexible printed circuit board includes a first terminal and a second terminal that are electrically connected, the first terminal being electrically connected to the touch signal line, and the second terminal being electrically connected to the touch driving circuit; and arranging the touch panel on a display side of the display panel, and enabling an orthographic projection of the first terminal on the display panel to fall within the second region, wherein an orthographic projection of the touch electrode on the display panel falls within the first region, the touch flexible printed circuit board is bent to a non-display side of the display panel, and the touch driving circuit is disposed on the non-display side of the display panel.

According to a third aspect of the embodiments of the present disclosure, a terminal is provided. The terminal includes any one of the touch display devices according to the first aspect.

DETAILED DESCRIPTION

The embodiments of the present disclosure are described below with reference to the accompanying drawings.

Figure 1:
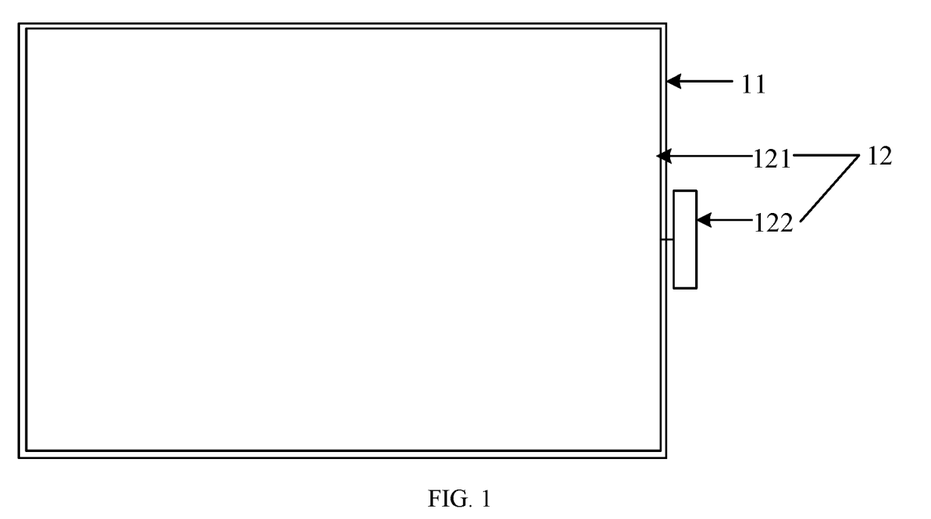
FIG. 1 is a schematic structural diagram of a touch display device.

FIG. 1 is a schematic structural diagram of a touch display device. The touch display device 10 includes a display panel 11, and a touch panel (TSP) 12 disposed on a display surface (the display surface is a surface of the display panel 11 for image display, and the display surface in FIG. 1 is a surface of the display panel 11 proximal to the touch panel 12) of the display panel 11.

The touch panel 12 may include a touch structure 121 for collecting touch signals, and a connection end 122 connected to the touch structure 121. The connection end 122 may be connected to a touch controller (not shown in FIG. 1). A light transmittance of the touch panel 12 is generally higher (exemplarily, the light transmittance of the touch panel may be above 80%), so that a user can view the display surface through the touch panel 12. The touch structure 121 is configured to perform touch control on a picture displayed on the display surface.

However, in the case where the touch panel 12 is arranged on the display surface 111 of the display panel 11, the connection end 122 may extend beyond the display panel 11 and extend out of the display panel 11 to hang in the air. Without the support of the display panel 11, the connection end 122 and a connection line (the connection line is usually a metal line that is prone to break) between the connection end 122 and the touch structure 121 are easily damaged, and thus a yield rate (the yield rate may refer to a ratio of qualified touch display devices in a certain number of manufactured touch display devices) of the touch display device is lower.

Figure 2:
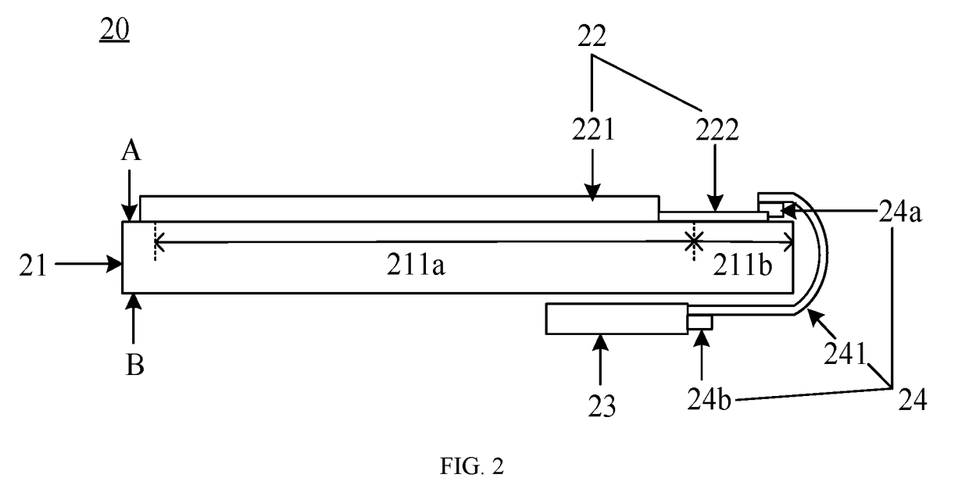
FIG. 2 is a schematic structural diagram of a touch display device according to an embodiment of the present disclosure.

FIG. 2 is a schematic structural diagram of a touch display device according to an embodiment of the present disclosure. The touch display device 20 may include the followings.

A display panel 21 includes a first region 211a, and a second region 211b extending outside the first region 211a on least one edge of the first region 211a, wherein a length of a boundary line between the first region 211a and the second region 211b is less than that of the at least one edge of the display panel 21, and an effective display area (AA) aa of the display panel 21 is disposed in the first region 211a. The effective display area is an area where a picture is actually displayed.

A touch panel 22 is disposed on a display side A (i.e., a side of the display panel 21 for picture display) of the display panel 21, and includes a touch electrode 221 and a touch signal line 222 electrically connected to the touch electrode 221, wherein an orthographic projection of the touch electrode 221 on the display panel 21 falls within the first region 211a. The touch electrode 221 may be a resistive touch electrode, a capacitive touch electrode or other types of touch electrodes, which is not limited in the embodiments of the present disclosure.

A touch driving circuit 23 is disposed on a non-display side B (the non-display side is the other side opposite to the display side) of the display panel 21.

A touch flexible printed circuit board (TFPC) 24 includes a first terminal 24a and a second terminal 24b that are electrically connected, wherein the first terminal 24a is electrically connected to the touch signal line 222 (exemplarily, the first terminal may be connected to the touch signal line by an anisotropic conductive film), the touch flexible printed circuit board 24 is bent to the non-display side B of the display panel 21, and the second terminal 24b is electrically connected to the touch driving circuit 23. Herein, FIG. 2 only schematically shows a structure of the first terminal 24a and the second terminal 24b, which is not limited in the embodiments of the present disclosure.

Figure 3:
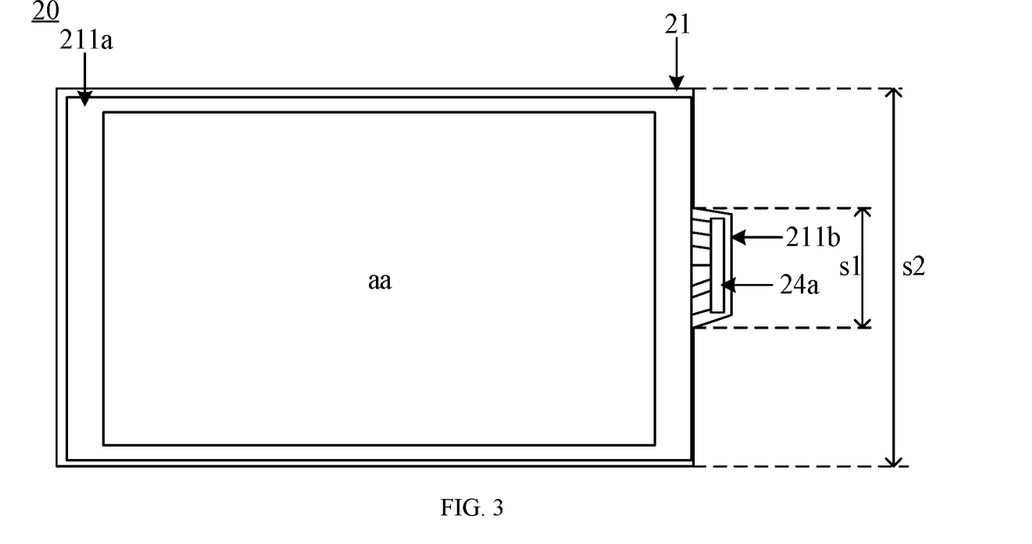
FIG. 3 is a top view of the touch display device shown in FIG. 2.

FIG. 3 is a top view of the touch display device shown in FIG. 2 (the touch flexible printed circuit board is not shown in FIG. 3). It can be seen that the length s1 of the boundary line between the first region 211a and the second region 211b is less than the length s2 of the edge of the second region 211b. The display panel 21 is provided with the second region 211b protruding from the first region 211a, and an orthographic projection of the first terminal 24a on the display panel 21 falls within the second region 211b. The second region 211b protruding in this way may serve as a support for the first terminal 24a to prevent the first terminal 24a from extending out of the display panel 21.

In related arts, after the touch signal line extending out of the display panel is connected to the touch controller disposed on a back surface of the display panel by the flexible printed circuit board, the touch signal line is relatively prone to break under a pull of the flexible printed circuit board. However, in the touch panel according to the present disclosure, the touch signal line and the first terminal are connected onto the second region of the display panel, and the second region supports the first terminal and the touch signal line, so that a possibility of breakage of the touch signal line is reduced, thereby improving a yield rate of the touch display panel. In summary, the touch display device provided by the embodiment of the present disclosure includes the display panel, the touch panel disposed on the display side of the display panel, the touch driving circuit, and the touch flexible printed circuit board, wherein the display panel includes the first region, and the second region extending outside the first region on the at least one edge of the first region; the touch flexible printed circuit board electrically connects the touch panel with the touch driving circuit disposed on the non-display side of the display panel; and the orthographic projection of the first terminal of the flexible printed circuit board connected to the touch panel on the display panel falls within the second region. The first terminal is supported by the second region, so that the possibility that the first terminal extends out of the display panel to hang in the air is reduced, thereby reducing the damage probability of the first terminal. Thus, an effect of improving the yield rate of the touch display device is achieved.

Optionally, the touch flexible printed circuit board 24 includes a flexible substrate 241 as well as a first terminal 24a and a second terminal 24b that are disposed on the flexible substrate 241.

Figure 4:
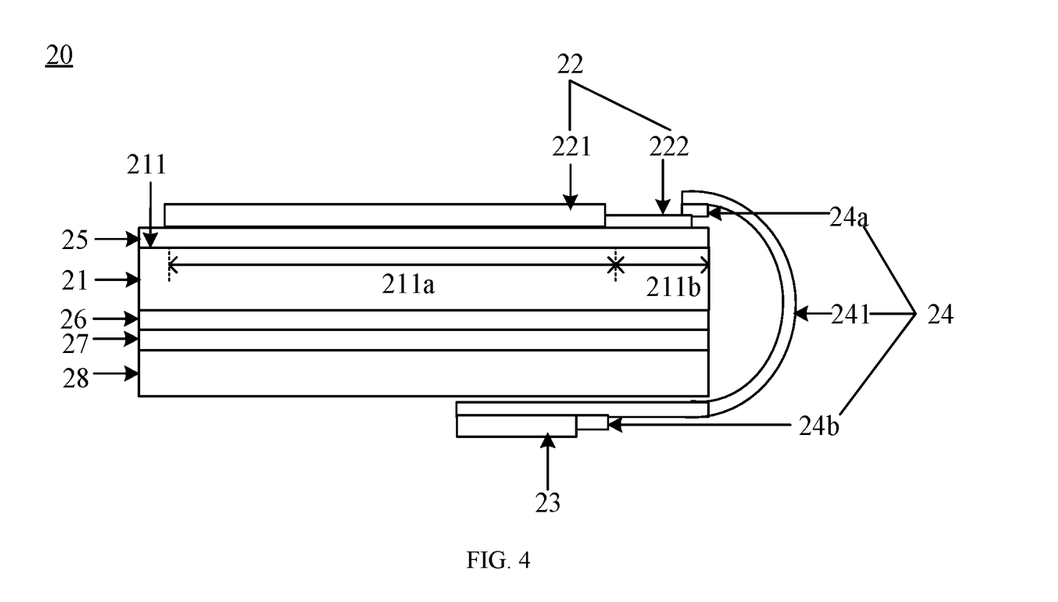
FIG. 4 is a schematic structural diagram of another touch display device according to an embodiment of the present disclosure.

FIG. 4 is a schematic structural diagram of another touch display device according to an embodiment of the present disclosure. The touch display device is adjusted on the basis of the touch display device 20 shown in FIG. 2.

Optionally, the touch display device 20 includes an optically clear adhesive (OCA) 25 disposed between the touch panel 22 and the display panel 21 to bond (including bonding a connection end in the touch panel with a touch track region on the display panel) the touch panel 22 and the display panel 21. The optically clear adhesive is a kind of adhesive having a light transmittance above 90% and a higher bonding strength, can be cured at a room temperature or medium temperature, and has advantages of low curing shrinkage and the like.

Optionally, the touch display device 20 includes a pressure sensitive adhesive (PSA) 26 disposed on a surface of the display panel 21 distal from the touch panel 22, a bottom film 27, and a foam 28. The pressure sensitive adhesive 26 (a material of the pressure sensitive adhesive may include polyethylene terephthalate (PET)), the bottom film 27 and the foam 28 are stacked in a direction going distally from the display panel 21. The pressure sensitive adhesive 26 bonds the bottom film 27 onto a back surface (the back surface is the other surface opposite to the display surface) of the display panel 21; and the bottom film 27 and the foam 28 are configured to protect the display panel 21.

As shown in FIG. 3, the second region 211b may be approximately in a trapezoidal shape; and a longer edge is disposed on a side of a shorter edge proximal to the first region 211a in two parallel edges of the second region 211b. As the number of touch signal lines connected to the touch electrodes may be larger, in the case where the touch signal lines are converged to the first terminal, the touch signal lines can form an approximately trapezoidal layout. In the case where the second region 211b is also in a trapezoidal shape, area of the second region 211b can be reduced, so that an overall size of the display device is reduced.

The approximate trapezoid may refer to a shape enclosed by four sides in an overall trapezoidal shape, and may include a conventional trapezoid and an approximate trapezoid with an arc top angle or the like, which is not showed in the embodiment of the present disclosure.

Figure 5:
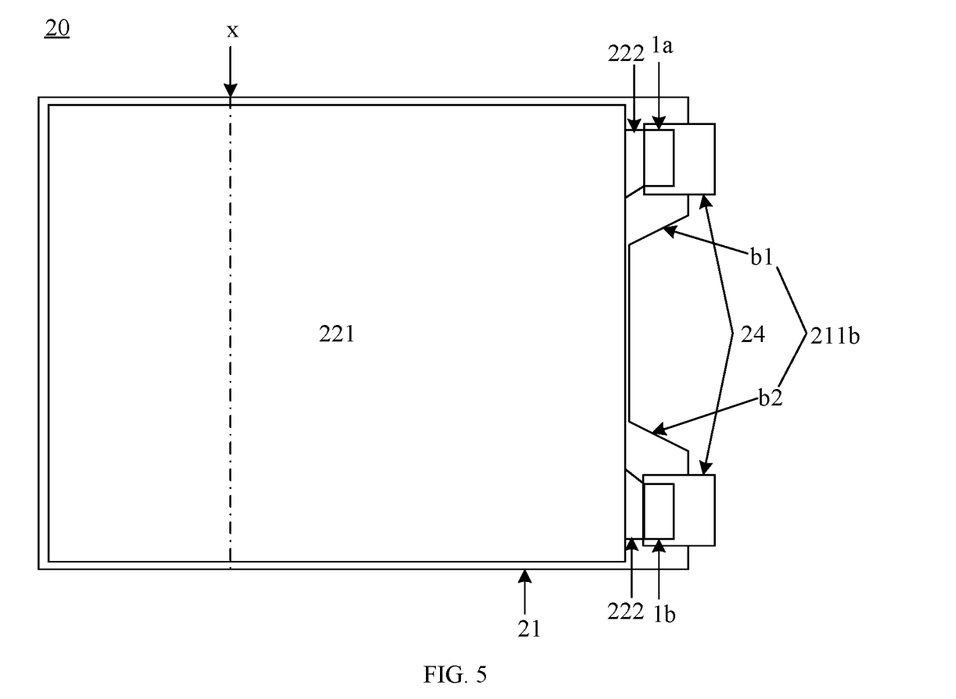
FIG. 5 is a top view of the touch display device shown in FIG. 4.

FIG. 5 is a top view of the touch display device shown in FIG. 4. Herein, the second region 211b includes at least one sub-track region (in FIG. 5, the sub-track regions including b1 and b2 are taken as an example for illustration, but the number of sub-track regions is not limited). The first terminal 24a includes at least one first sub-terminal (in FIG. 5, the first sub-terminals including 1a and 1b are taken as an example for illustration, but the number of first sub-terminals is not limited). An orthographic projection of each of the at least one first sub-terminal on the display panel 21 falls within the at least one sub-track region in one-to-one correspondence. Each of the at least one first sub-terminal is electrically connected to the touch signal line 222.

Figure 6:
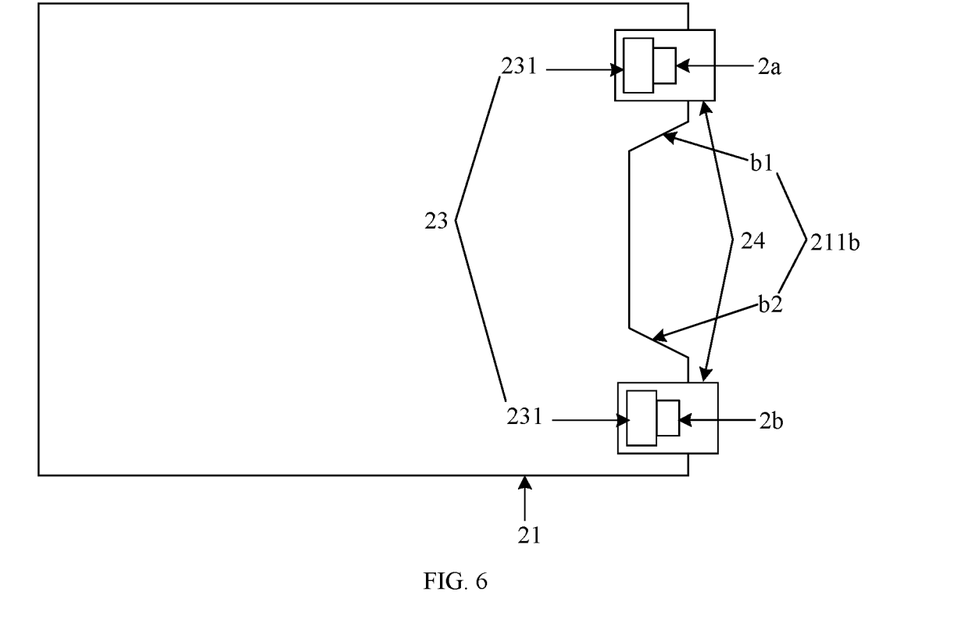
FIG. 6 is a bottom view of the touch display device shown in FIG. 4.

FIG. 6 is a top view of the touch display device shown in FIG. 4. Herein, the second terminal 24b includes at least one second sub-terminal (in FIG. 6, the second sub-terminals including 2a and 2b are taken as an example for illustration, but the number of second sub-terminals is not limited). The at least one second sub-terminal is electrically connected to the at least one first sub-terminal (the first sub-terminals may refer to 1a and 1b in FIG. 5) in one-to-one correspondence. The at least one second sub-terminal is electrically connected to the touch driving circuit 23.

Optionally, the touch driving circuit 23 includes at least one sub-driving circuit 231 electrically connected to the at least one second sub-terminal (2a and 2b) in one-to-one correspondence. Each of the sub-driving circuit may include a touch integrated circuit (IC). That is, the touch structure in the touch panel may be controlled by at least one sub-driving circuit. In the case where a size of the touch panel is larger, an internal structure of the touch panel can be more complicated, and more touch signals can be received. In order to process the touch signals quickly, more than one sub-driving circuit may be adopted to control the touch panel.

Optionally, a plurality of sub-driving circuits 231 are disposed on two touch flexible printed circuit boards 24, respectively; and the touch flexible printed circuit boards 24 can electrically connect the driving sub-circuits 231 with the touch electrodes disposed on the other surface of the display panel 21.

Figure 7:
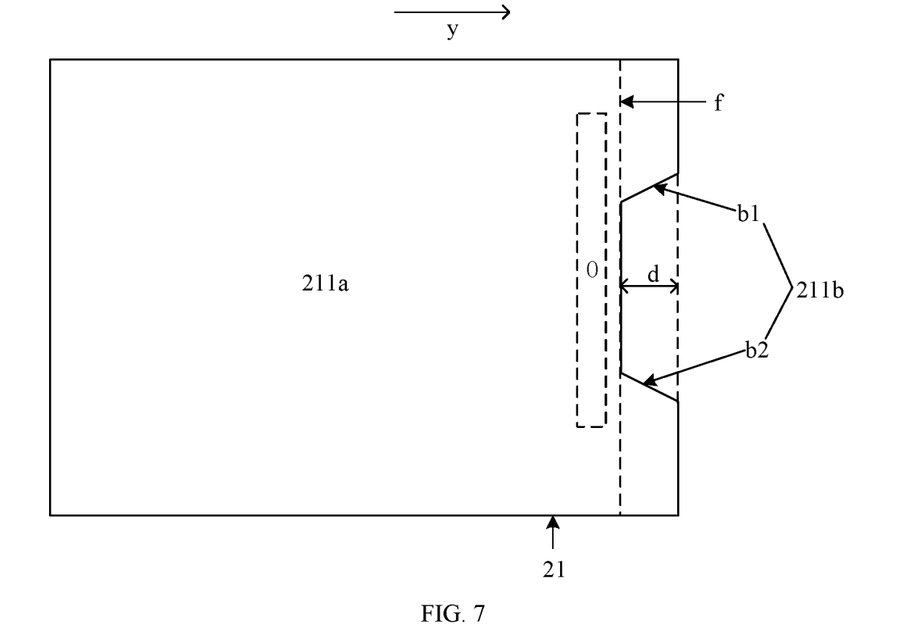
FIG. 7 is a schematic structural diagram of a display panel in the touch display device shown in FIG. 5.

Optionally, FIG. 7 is a schematic structural diagram of the display panel 21 in the touch display panel shown in FIG. 5. Herein, the first region 211a is approximately in a rectangular shape which is a shape of an effective display area that is convenient to adapt to various application scenes. The approximate rectangle may refer to a shape enclosed by four sides in an overall rectangular shape, and may include a conventional rectangle, an approximate rectangle with an arc top angle or the like, which is not shown in the embodiment of the present disclosure.

Optionally, in the case where the number of sub-track regions is greater than or equal to 2, the second region 211b includes a first sub-track region b1 and a second sub-track region b2 that are respectively disposed on two opposite ends of a first edge f of the display panel proximal to a fan-out region O (a region where the edges of the display panel lead out a plurality of tracks). In this way, the plurality of touch signal lines can be dispersedly arranged on the display panel more, so that density of the lines is reduced, thereby reducing the manufacturing difficulty of the touch display device. FIG. 7 shows a case where two sub-track regions are right-angled trapezoid. The two right-angled trapezoid sub-track regions are disposed on the two ends of the first edge f, so that the manufacturing of the special-shaped display panel is facilitated (the two sub-track regions can be formed by forming a notch on an edge of the rectangular display panel).

Figure 8:
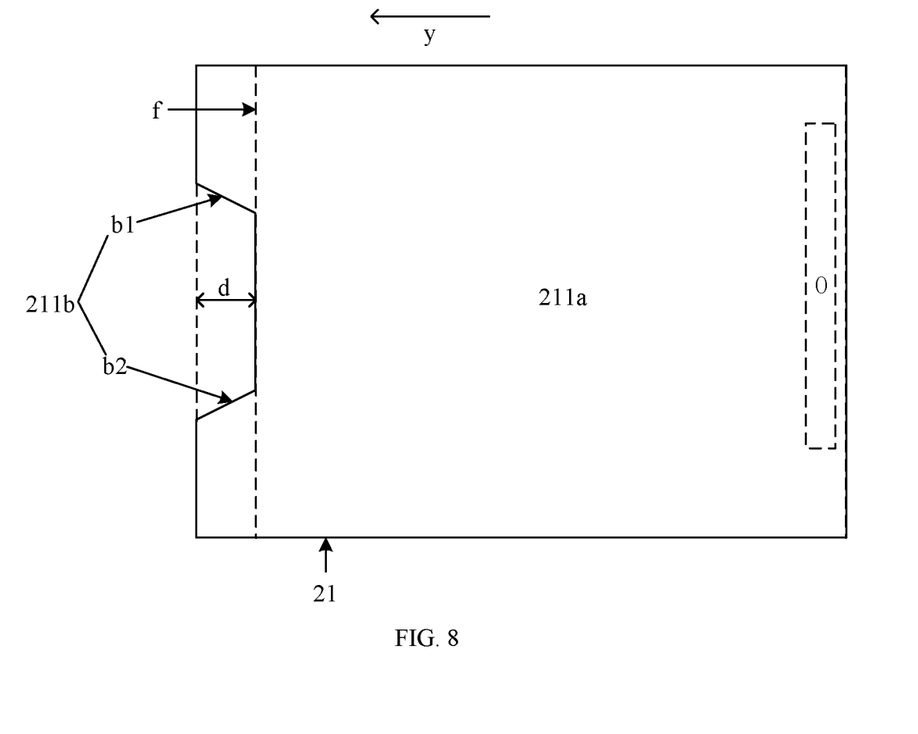
FIG. 8 is a schematic structural diagram of another display panel in the touch display device shown in FIG. 5.

In addition, as shown in FIG. 8, the first sub-track region b1 and the second sub-track region b2 may also be respectively disposed on two opposite ends of an edge of the display panel distal from the fan-out region O, so that the display panel and the touch panel can be respectively connected to respective control devices on two opposite edges of the display panel. As a result, the connection line between the display panel and the control device thereof cannot mutually influence a connection line between the touch panel and the control device thereof.

The fan-out region O in FIGS. 7 and 8 is only shown schematically, and the shape, size or the like of the fan-out region are not limited.

Optionally, each of a length d of the first sub-track region b1 and the second sub-track region b2 in the direction y perpendicular to the first edge f is greater than or equal to a specified tolerance which is a tolerance in the case where the touch panel is attached to the display surface of the display panel. Setting the length D to be greater than or equal to the specified tolerance can ensure that the touch signal line does not extend out of the display panel. Optionally, the specified tolerance is about 0.3 mm. In the case where the touch panel is arranged on the display panel, the tolerance is generally not greater than 0.3 mm.

Figure 9:
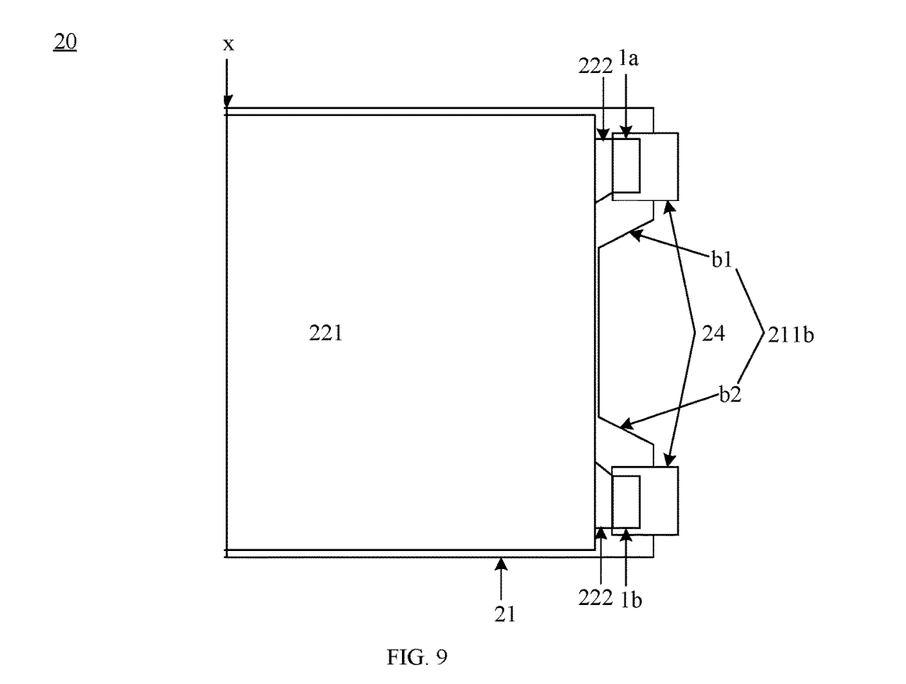
FIG. 9 is a folded schematic diagram of the touch display device shown in FIG. 5.

As shown in FIG. 5, the touch display device 20 may be a folding touch display device. Folding (the folding may include inward folding (i.e., a folding mode in which the display surface is disposed inside after folding) and outward folding (i.e., a folding mode in which the display surface is disposed outside after folding)) may be performed on at least one position on the touch display device 20. The touch display device 20 shown in FIG. 5 can be folded around a rotation axis x which is parallel to the first edge (not shown in FIG. 5). In the case where the touch display device 20 is folded outward, a folded structure may be shown in FIG. 9. It can be seen that a part of the touch display device 20 is folded to its back.

In the case where the touch display device 20 is a folding touch display device, both the touch panel and the display panel may be provided with flexibility to facilitate folding. Exemplarily, the touch panel may be fabricated by a flexible material, and the display panel may be a flexible organic light emitting diode (OLED) display panel or other flexible display panel.

In summary, the touch display device provided by the embodiment of the present disclosure includes the display panel, the touch panel disposed on the display side of the display panel, the touch driving circuit, and the touch flexible printed circuit board, wherein the display panel includes the first region, and the second region extending outside the first region on the at least one edge of the first region; the touch flexible printed circuit board electrically connects the touch panel with the touch driving circuit disposed on the non-display side of the display panel; and the orthographic projection of the first terminal of the flexible printed circuit board connected to the touch panel on the display panel falls within the second region. The first terminal is supported by the second region, so that the possibility that the first terminal extends out of the display panel to hang in the air is reduced, thereby reducing the damage probability of the first terminal. Thus, an effect of improving the yield rate of the touch display device is achieved.

Figure 10:
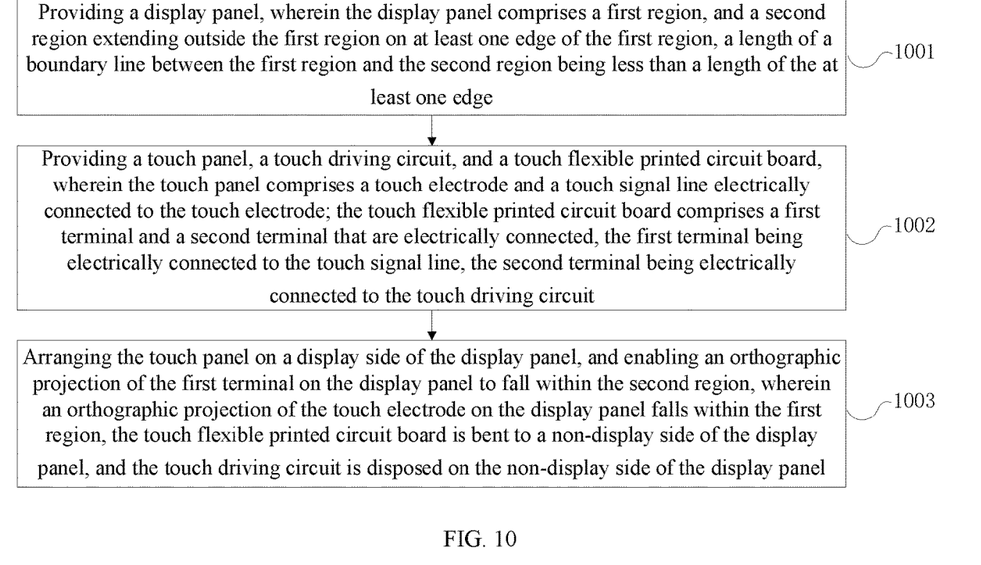
FIG. 10 is a flow chart of a manufacturing method of a touch display device according to an embodiment of the present disclosure.

FIG. 10 is a flow chart of a manufacturing method of a touch display device according to an embodiment of the present disclosure. The method includes the following steps.

In step 1001, a display panel is provided, wherein the display panel includes a first region, and a second region extending outside the first region on at least one edge of the first region, a length of a boundary line between the first region and the second region being less than a length of the at least one edge.

A structure of the display panel may refer to that of the display panel 21 in any of the above embodiments, which is not repeated herein.

In step 1002, a touch panel, a touch driving circuit, and a touch flexible printed circuit board are provided, wherein the touch panel includes a touch electrode and a touch signal line electrically connected to the touch electrode; the touch flexible printed circuit board includes a first terminal and a second terminal that are electrically connected, the first terminal being electrically connected to the touch signal line, the second terminal being electrically connected to the touch driving circuit.

A structure of the display panel may refer to that of the display panel 22 in any of the above embodiments, which is not repeated herein.

In step 1003, the touch panel is arranged on a display side of the display panel, and an orthographic projection of the first terminal on the display panel is enabled to fall within the second region, wherein the orthographic projection of the touch electrode on the display panel falls within the first region, the touch flexible printed circuit board is bent to a non-display side of the display panel, and the touch driving circuit is disposed on the non-display side of the display panel.

The touch panel can be bonded on the display side of the display panel by an optically clear adhesive.

In summary, the manufacturing method of the touch display device is provided by the embodiment of the present disclosure. According to the manufacturing method of the touch display device provided by the embodiment of the present disclosure, the touch display device is manufactured, and includes the display panel, the touch panel disposed on the display side of the display panel, the touch driving circuit, and the touch flexible printed circuit board, wherein the display panel includes the first region, and the second region extending outside the first region on the at least one edge of the first region; the touch flexible printed circuit board electrically connects the touch panel with the touch driving circuit disposed on the non-display side of the display panel; and the orthographic projection of the first terminal of the flexible printed circuit board connected to the touch panel on the display panel falls within the second region. The first terminal is supported by the second region, so that the possibility that the first terminal extends out of the display panel to hang in the air is reduced, thereby reducing the damage probability of the first terminal. Thus, an effect of improving the yield rate of the touch display device is achieved.

The present disclosure further provides a terminal. The terminal may include any one of the touch display devices provided in the above embodiments. The terminal may be a mobile phone, a tablet computer, a display, a notebook computer and other terminals with display and touch control functions.

In the drawings, the dimensions of layers and regions may be exaggerated for the clarity of illustration. It also can be understood that in the case where an element or a layer is referred to as "on" another element or layer, the element or layer may be directly arranged on the other element, or there may be an intermediate layer. In addition, it can be understood that in the case where an element or a layer is referred to as "under" another element or layer, the element or layer may be directly arranged under the other element, or there may be more than one intermediate layer or element. Moreover, understandably, in the case where a layer or an element is referred to as being "between" two layers or two elements, the layer or element may be the only one layer between the two layers or the two elements, or there may be more than one intermediate layer or element. Similar reference numerals indicate similar elements throughout the text.

The term "first" or "second" used in the present disclosure is merely configured to describe but not denote or imply any relative importance. The term "a plurality of" means two or more, unless otherwise expressly provided.

The foregoing descriptions are only optional embodiments of the present disclosure, and do not intend to limit the present disclosure. Any variation, equivalent substitution, modification and the like that fall within the spirit and principle of the present disclosure should be embraced by the protective scope of the present disclosure.

What is claimed is:

1. A touch display device, comprising:
   a display panel, wherein the display panel comprises a first region, and a second region extending outside the first region on at least one edge of the first region, a length of a boundary line between the first region and the second region being less than a length of the at least one edge, an effective display area of the display panel being disposed in the first region;
   a touch panel, wherein the touch panel is disposed on a display side of the display panel, and comprises a touch electrode and a touch signal line electrically connected to the touch electrode, an orthographic projection of the touch electrode on the display panel falling within the first region;
   a touch driving circuit disposed on a non-display side of the display panel; and
   a touch flexible printed circuit board, wherein the touch flexible printed circuit board comprises a first terminal and a second terminal that are electrically connected, the first terminal being electrically connected to the touch signal line, the touch flexible printed circuit board being bent to the non-display side of the display panel, the second terminal being electrically connected to the touch driving circuit;
   wherein an orthographic projection of the first terminal on the display panel falls within the second region;
   the first region is approximately in a rectangular shape, the second region comprises at least one sub-track region, wherein the number of sub-track regions is equal to 2, the second region comprises a first sub-track region and a second sub-track region, the first sub-track region and the second sub-track region being respectively disposed on two opposite ends of a first edge of the first region proximal to a fan-out region of the display panel.

2. The touch display device of claim 1, wherein the first terminal comprises at least one first sub-terminal, an orthographic projection of each of the at least one first sub-terminal on the display panel falling within the at least one sub-track region in one-to-one correspondence, each of the at least one first sub-terminal being electrically connected to the touch signal line.

3. The touch display device of claim 2, wherein the second terminal comprises at least one second sub-terminal, the at least one second sub-terminal being electrically connected to the at least one first sub-terminal in one-to-one correspondence, and being electrically connected to the touch driving circuit.

4. The touch display device of claim 3, wherein the touch driving circuit comprises at least one sub-driving circuit electrically connected to the at least one second sub-terminal in one-to-one correspondence.

5. The touch display device of claim 4, wherein the touch display device comprises a pressure sensitive adhesive, a bottom film, and a foam that are sequentially arranged on a surface of the display panel distal from the touch panel, the pressure sensitive adhesive, the bottom film and the foam being stacked in a direction going distally from the display panel;
   wherein the touch flexible printed circuit board bent to the non-display side is attached to a side of the foam distal from the display panel.

6. The touch display device of claim 3, wherein the touch display device comprises a pressure sensitive adhesive, a bottom film, and a foam that are sequentially arranged on a surface of the display panel distal from the touch panel, the pressure sensitive adhesive, the bottom film and the foam being stacked in a direction going distally from the display panel;
   wherein the touch flexible printed circuit board bent to the non-display side is attached to a side of the foam distal from the display panel.

7. The touch display device of claim 2, wherein the touch display device comprises a pressure sensitive adhesive, a bottom film, and a foam that are sequentially arranged on a surface of the display panel distal from the touch panel, the pressure sensitive adhesive, the bottom film and the foam being stacked in a direction going distally from the display panel;
   wherein the touch flexible printed circuit board bent to the non-display side is attached to a side of the foam distal from the display panel.

8. The touch display device of claim 1, wherein each of lengths of the first sub-track region and the second sub-track region in a direction perpendicular to the first edge of the first region is greater than or equal to a specified tolerance, the specified tolerance being a tolerance in the case where the touch panel is arranged on the display side of the display panel.

9. The touch display device of claim 8, wherein the specified tolerance is about 0.3 millimeters.

10. The touch display device of claim 9, wherein the touch display device comprises a pressure sensitive adhesive, a bottom film, and a foam that are sequentially arranged on a surface of the display panel distal from the touch panel, the pressure sensitive adhesive, the bottom film and the foam being stacked in a direction going distally from the display panel;
    wherein the touch flexible printed circuit board bent to the non-display side is attached to a side of the foam distal from the display panel.

11. The touch display device of claim 8, wherein the touch display device comprises a pressure sensitive adhesive, a bottom film, and a foam that are sequentially arranged on a surface of the display panel distal from the touch panel, the pressure sensitive adhesive, the bottom film and the foam being stacked in a direction going distally from the display panel;
> wherein the touch flexible printed circuit board bent to the non-display side is attached to a side of the foam distal from the display panel.

12. The touch display device of claim 1, wherein the touch display device comprises an optically clear adhesive disposed between the touch panel and the display panel.

13. The touch display device of claim 1, wherein the second region is approximately in a trapezoidal shape; and a longer edge is disposed on a side of a shorter edge proximal to the first region in two parallel edges of the second region.

14. The touch display device of claim 1, wherein the touch display device comprises a pressure sensitive adhesive, a bottom film, and a foam that are sequentially arranged on a surface of the display panel distal from the touch panel, the pressure sensitive adhesive, the bottom film and the foam being stacked in a direction going distally from the display panel;
> wherein the touch flexible printed circuit board bent to the non-display side is attached to a side of the foam distal from the display panel.

15. The touch display device of claim 1, wherein the touch display device is a folding touch display device comprising a rotating shaft, the rotating shaft being parallel to the first edge.

16. The touch display device of claim 1, wherein the second region comprises at least one sub-track region, the first terminal comprises at least one first sub-terminal, an orthographic projection of each of the at least one first sub-terminal on the display panel falling within the at least one sub-track region in one-to-one correspondence, each of the at least one first sub-terminal being electrically connected to the touch signal line;
> the second terminal comprises at least one second sub-terminal, the at least one second sub-terminal being electrically connected to the at least one first sub-terminal in one-to-one correspondence, and being electrically connected to the touch driving circuit;
> the touch driving circuit comprises at least one sub-driving circuit electrically connected to the at least one second sub-terminal in one-to-one correspondence; and
> the second region is approximately in a trapezoidal shape, and a longer edge is disposed on a side of a shorter edge proximal to the first region in two parallel edges of the second region.

17. A manufacturing method of a touch display device, comprising:
> providing a display panel, wherein the display panel comprises a first region, and a second region extending outside the first region on at least one edge of the first region, a length of a boundary line between the first region and the second region being less than a length of the at least one edge;
> providing a touch panel, a touch driving circuit, and a touch flexible printed circuit board, wherein the touch panel comprises a touch electrode and a touch signal line electrically connected to the touch electrode; the touch flexible printed circuit board comprises a first terminal and a second terminal that are electrically connected, the first terminal being electrically connected to the touch signal line, the second terminal being electrically connected to the touch driving circuit; and
> arranging the touch panel on a display side of the display panel, and enabling an orthographic projection of the first terminal on the display panel to fall within the second region, wherein an orthographic projection of the touch electrode on the display panel falls within the first region, the touch flexible printed circuit board is bent to a non-display side of the display panel, and the touch driving circuit is disposed on the non-display side of the display panel;
> wherein the first region is approximately in a rectangular shape, the second region comprises at least one sub-track region, wherein the number of sub-track regions is equal to 2, the second region comprises a first sub-track region and a second sub-track region, the first sub-track region and the second sub-track region being respectively disposed on two opposite ends of a first edge of the first region proximal to a fan-out region of the display panel.

18. A terminal, comprising a touch display device comprising:
> a display panel, wherein the display panel comprises a first region, and a second region extending outside the first region on at least one edge of the first region, a length of a boundary line between the first region and the second region being less than a length of the at least one edge, an effective display area of the display panel being disposed in the first region;
> a touch panel, wherein the touch panel is disposed on a display side of the display panel, and comprises a touch electrode and a touch signal line electrically connected to the touch electrode, an orthographic projection of the touch electrode on the display panel falling within the first region;
> a touch driving circuit disposed on a non-display side of the display panel; and
> a touch flexible printed circuit board, wherein the touch flexible printed circuit board comprises a first terminal and a second terminal that are electrically connected, the first terminal being electrically connected to the touch signal line, the touch flexible printed circuit board being bent to the non-display side of the display panel, the second terminal being electrically connected to the touch driving circuit;
> wherein an orthographic projection of the first terminal on the display panel falls within the second region;
> the first region is approximately in a rectangular shape, the second region comprises at least one sub-track region, wherein the number of sub-track regions is equal to 2, the second region comprises a first sub-track region and a second sub-track region, the first sub-track region and the second sub-track region being respectively disposed on two opposite ends of a first edge of the first region proximal to a fan-out region of the display panel.

\* \* \* \* \*